United States Patent [19]

Sinclair et al.

[11] Patent Number: 4,470,289

[45] Date of Patent: Sep. 11, 1984

[54] IC PIN ADJUSTMENT TOOL

[75] Inventors: William Y. Sinclair, Stockton, N.J.; Rocco F. Basile, Virginia Beach, Va.; Edward A. Kurz, Flemington, N.J.

[73] Assignee: Aries Electronics, Inc., Frenchtown, N.J.

[21] Appl. No.: 373,360

[22] Filed: Apr. 29, 1982

[51] Int. Cl.³ ............................................... B21F 1/00
[52] U.S. Cl. ....................................... 72/401; 140/106
[58] Field of Search ...................... 140/105, 106, 123; 72/384, 387, 401, 409

[56] References Cited

U.S. PATENT DOCUMENTS

| 2,955,624 | 10/1960 | Ferm | 140/123 |
| 3,267,716 | 8/1966 | Hales | 72/384 |
| 3,692,069 | 9/1972 | Clendennen et al. | 72/384 |

Primary Examiner—Francis S. Husar
Assistant Examiner—L. McLaughlin
Attorney, Agent, or Firm—Anthony J. Casella; Gerald E. Hespos

[57] ABSTRACT

An IC pin adjustment tool includes a pair of side arms and a center portion disposed between the side arms. The side arms are hingedly mounted on the center portion at one end thereof, and biased outwardly away from the center portion by spring means attached to the other end of the side arms. The center portion, and the portions of the side arms adjacent to the center portion, are configured such that an IC of either of two widths may be disposed on the associated one of two sides of the center portion such that the IC pins extend into gaps between the side arms and the center portion. By squeezing the side arms toward each other, the side arms force the pins toward the center portion to thereby adjust the orientation of the pins, such that they may immediately be inserted into an IC socket without further adjustment.

3 Claims, 8 Drawing Figures

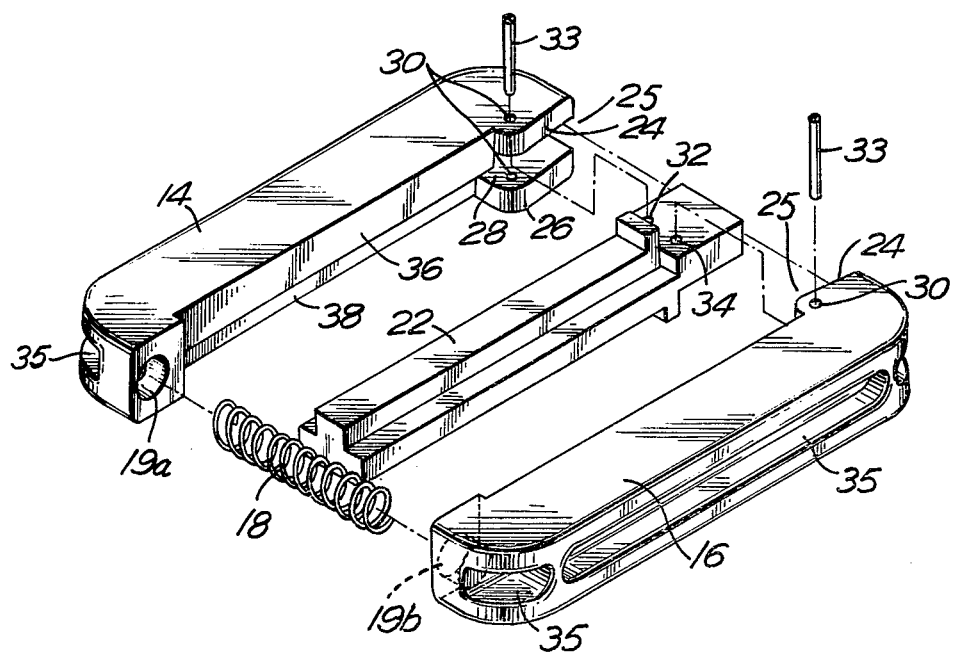
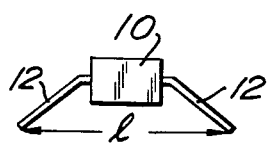
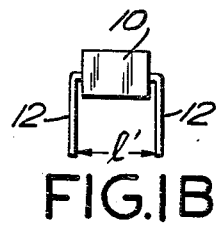
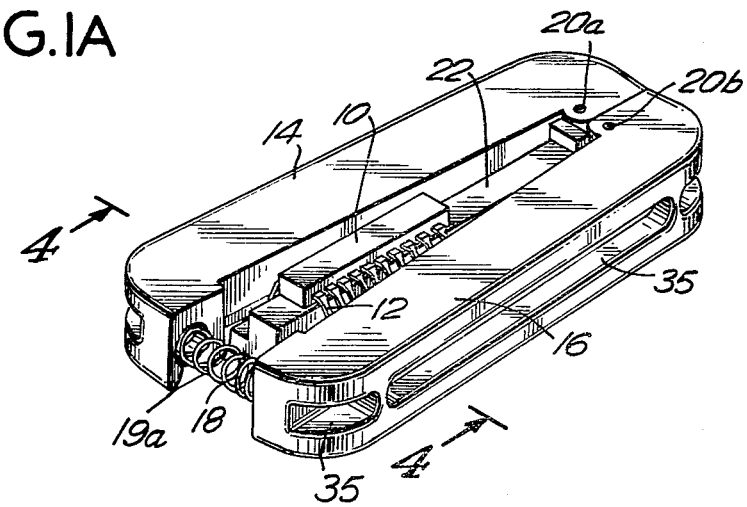
FIG. 1A  FIG. 2A  FIG. 1B
FIG. 2B

IC PIN ADJUSTMENT TOOL

BACKGROUND OF THE INVENTION

With the increasing use of integrated circuits (IC's) in consumer, industrial and business electronic equipment, extremely high levels of circuit complexity are available. Many times, especially in the communications or computer fields, a circuit board may be entirely filled with IC's such as memories, logic circuits, and the like.

In view of the large numbers of IC's employed in such systems, the insertion of the IC's into suitable sockets becomes a limiting factor in the fabrication time and cost of such systems. Usually, the IC's are in the form of a dual in line package (DIP), usually varying from 0.3 to 0.6 inches in width, and may contain as little as one, or as many as twenty leads or "pins" on each side of the IC. Insertion of the IC's into the associated sockets on the printed circuit boards is made difficult whenever the pins on the IC's are not properly aligned. Clearly, this becomes a major problem when inserting IC's having up to 40 pins, each of which must be properly aligned before insertion can be achieved. Unfortunately, a significantly large portion of the IC's, as manufactured, have at least a few pins which are substantially out of alignment for proper insertion. This misalignment must be corrected in what has heretofore been a time-consuming operation, leading to significantly increased fabrication time and cost.

There exist certain tools which provide some degree of pin adjustment capability. "Insertion tools" provide a rudimentary type of alignment. Typically, an insertion tool is formed by two vertically disposed parallel plates spaced by a distance approximately equal to that of the width of the IC to be inserted. The IC is pushed into the insertion tool, between the parallel plates, and any pins which are bent outwardly hopefully return to a position which will allow insertion. The pin is then inserted into the socket while still in the insertion tool, and must be ejected from the tool after insertion.

A major drawback of the insertion tool is that a particular tool must be used for an associated particular IC size. For example, an insertion tool for a 0.3 inch width IC cannot be used with IC's of any other widths. Further, an insertion tool adapted for use with a low number of pins (i.e., 6 or 8 pins) cannot be used with an IC having a greater number of pins and vice versa. Finally, as noted above, the insertion of the IC must be accomplished while the IC is still in the tool, and must be ejected therefrom after insertion.

Still other tools are provided for straightening IC pins which are inwardly bent or crooked. However, by far, the most predominent problem associated with IC's are pins which are bent outwardly, since many IC's are manufactured out of tolerance, typical dimensions of the pins having center spacings as much as 0.395" or 0.695", rather than the maximum desired center spacings of 0.320" and 0.620".

OBJECTS AND SUMMARY OF THE INVENTION

It is therefore an object of the present invention to provide a tool, and a method, for rapidly and effectively straightening IC pins.

It is a further object of the invention to provide a device which rapidly and efficiently allows pins to be straightened for IC's of two different widths and virtually any number of pins.

It is a further object of the invention to provide a tool, and a method, which allows the pins on an IC to be quickly and easily straightened utilizing a "squeeze" type action.

It is a further object of the invention to provide a tool which straightens IC pins, separate and apart from the actual insertion of the IC's into the IC socket.

In accordance with a first aspect of the invention, a tool for adjusting the orientation of pins on an integrated circuit chip includes a pair of side arms and a center portion disposed between the side arms. A first side of the center portion is provided with a first width generally corresponding to the approximate width of an integrated circuit chip of a first size. When the chip of the first size is placed on the first side of the center portion, such that the pins extend into gaps between the side arms and the center portion, the side arms may be moved toward each other to force the pins toward the center portion to thereby adjust the orientation of the pins.

The second side of the center portion may be provided with a second width substantially different from the first width and generally corresponding to the approximate width of an integrated circuit chip of a second size. When the chip of the second size is placed on the second side of the center portion such that its pins extend into gaps between the side arms and the center portion, the side arms may be moved toward each other to force the pins toward the center portion to thereby adjust the orientation of the pins.

Specifically, the surfaces of the side arms adjacent to the center portion have configurations substantially complementary to the surfaces of the center portion adjacent to the surfaces of the side arms. According to the preferred embodiment, the center portion is generally T-shaped in configuration. The pair of side arms are secured to the center portion by a respective pair of hinges disposed at a first end of the pair of side arms and the center portion. Further, a spring may be disposed between the pair of side arms at a second end thereof opposite the first end for biasing the side arms away from each other.

According to a second aspect of the invention, a process for adjusting the orientation of pins on an integrated circuit chip includes the steps of (i) disposing the chip on a center portion of a tool, the center portion having a width generally corresponding to the approximate width of the chip such that the pins extend into gaps between the center portion and a pair of side arms on either side of the center portion, and (ii) moving the side arms toward each other to thereby force the pins toward the center portion to thereby adjust the orientation of the pins.

Specifically, the step of moving may further include moving the pair of side arms toward each other in a respective pair of arcuate paths. According to a preferred embodiment, the side arms are moved toward each other against an outwardly biased force preferably provided by spring means attached to the pair of side arms.

BRIEF DESCRIPTION OF THE DRAWINGS

These and other objects and aspects of the invention will be described in more detail with reference to the following drawing figures of which:

FIG. 1A is a profile of an IC manufactured with outwardly bent pins;

FIG. 1B is a profile of an IC having properly oriented pins;

FIG. 2A is an exploded view of the IC pin adjustment tool illustrating the construction thereof;

FIG. 2B is a perspective view of the IC pin adjustment tool having an IC disposed thereon;

DETAILED DESCRIPTION OF THE INVENTION

Figure 3:
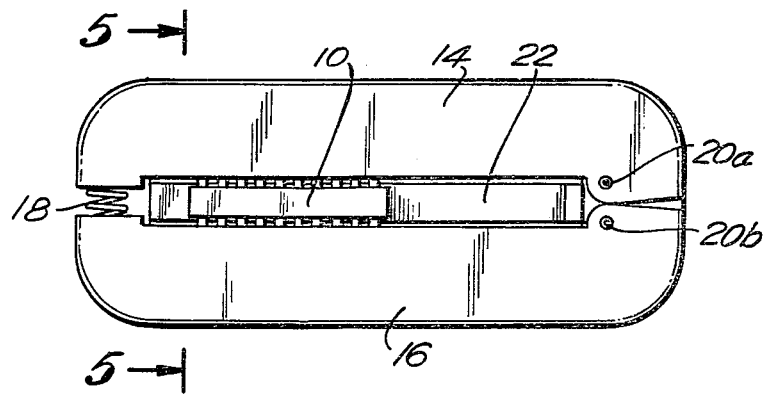
FIG. 3 is a top view of the IC pin adjustment tool in a closed position, and IC disposed therein.

FIG. 1A illustrates a typical IC 10 manufactured with pins 12 bent outwardly. The center spacing l between the leading edges of the pins 12 may be as much as 0.395" or 0.695" for 0.3 and 0.6 inch width IC's, respectively. The center spacing l is, in the case of the IC shown in FIG. 1A, significantly greater than the maximum spacing of 0.320 and 0.620 inch for 0.3 and 0.6 inch IC's, respectively, required for proper insertion. The center spacings of the leading edges of the pins 12 of the IC's manufactured as shown in FIG. 1A must be adjusted to the spacing l' as illustrated in FIG. 1B, at which time the IC may readily be inserted into the IC socket.

FIGS. 2A and 2B are perspective views of the IC pin adjustment tool in accordance with the present invention which allows an IC having outwardly bent pins, as illustrated in FIG. 1A, to be rapidly and easily adjusted to provide the appropriate center spacing l'. The tool comprises left and right side arms 14 and 16, respectively. The side arms 14 and 16 are connected to each other at the front by way of spring 18 disposed in recesses 19a and 19b formed in the opposed surfaces of the side arms. Disposed between the side arms 14 and 16 is a center portion 22 which is connected to the side arms 14 and 16 by way of hinges 20a and 20b, respectively. With particular reference to FIG. 2A, each of the side arms 14 and 16 is provided with a bifurcated tab 25 extending from each side arm substantially perpendicular therefrom. Each of the tabs 25 is separated into upper and lower portions 24 and 26, respectively, by slot 28 which is disposed in a plane substantially parallel to the top surface of the associated side arm. The upper and lower portions 24 and 26 of the tab 22 are provided with colinear holes 30. Center portion 22 is likewise provided with left and right holes 32 and 34, respectively, which are disposed so as to be in alignment with holes 30 on the associated side arms when the tool is assembled. Posts 33 or other suitable means are provided through the holes 30/32 and 30/34 to provide the hinges 20a and 20b, FIG. 2B. It should be noted, however, that other suitable hinge means may be used as well. The side arms and center portion may be constructed of any rigid material, preferably lightweight plastic. In forming the side arms and center portion, centrally located voids 35, FIGS. 2A, 2B, 4 and 5, may be provided in order to save material.

When constructed as described above, spring 18 outwardly biases the side arms such that they are normally separated as illustrated in FIG. 2B. By manually squeezing the side arms 14 and 16, toward each other against the force of the spring 18, each of the side arms 14 and 16 rotate about their respective hinges into a closed position. Upon releasing the tool, side arms 14 and 16 return to their original opened state under the force of spring 18.

Figure 4:
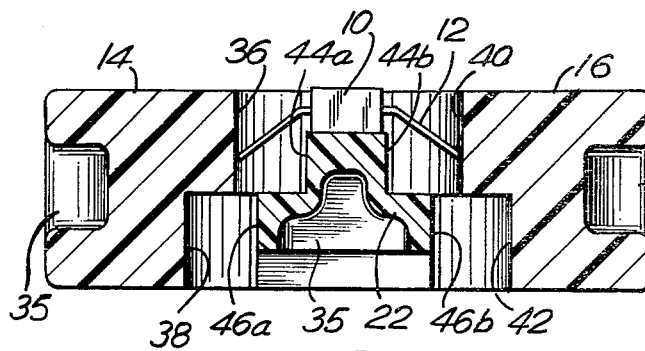
FIG. 4 is a cross-sectional view taken through section 4—4 of FIG. 2B illustrating the disposition of the IC on the center portion of the tool prior to adjustment.

The configuration of side arms 14 and 16 and center portion 22 will be further discussed with reference to FIGS. 2A and 4. As shown, side arm 14 is provided with first and second contact surfaces 36 and 38, respectively, both of which are disposed substantially vertically. Similarly, side arm 16 is provided with first and second contact surfaces 40 and 42, respectively, contact surfaces 40 and 42 on side arm 16 corresponding to contact surfaces 36 and 38, respectively, on side arm 14. The first contact surfaces 36 and 40 extend closer toward each other by a predetermined distance relative to the second contact surfaces 38 and 42.

The center portion 22 is similarly provided with first and second contact surface pairs 44a/44b and 46a/46b, respectively. The lateral distance between first contact surface pairs 44a and 44b is approximately equal to that of a narrow width IC, such as 0.3", while the lateral distance between second contact surface pairs 46a and 46b is approximately equal to the width of a larger IC, such as 0.6".

Figure 5:
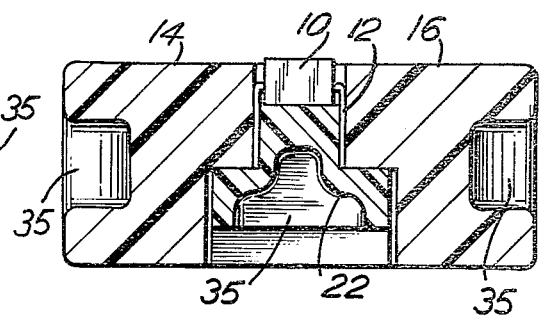
FIG. 5 is a cross-sectional view of the IC pin adjustment tool in a closed position, with the adjusted IC disposed thereon.

With reference to FIG. 5, it can be seen that the relative lateral positions of the contact surfaces are such that, upon moving the side arms toward the center portion, contact surfaces 36 and 40 will abut surfaces 44a and 44b, respectively, and surfaces 38 and 42 will abut surfaces 46a and 46b, respectively, at substantially the same time. As shown in the figures the cross-section of the center portion 22 is in the shape of an inverted T, but such configuration is not necessary, other configurations being obtainable by laterally moving the first contact surface pair 44a and 44b relative to the second contact surface pair 46a and 46b, if so desired. If so moved, the associated first contact surfaces 36 and 40 will likewise be laterally moved relative to the second contact surfaces. Further, although each of the contact surfaces described in FIGS. 4 and 5 are illustrated as being exactly vertical, minor variations in the orientation of the surfaces may be provided as desired. The side arms 14 and 16 have, on the outer surfaces thereof, recesses 35, as shown in FIGS. 2A, 2B, 4 and 5.

In operation, the IC 10 illustrated in FIG. 1A is placed on center portion 22 such that it straddles the center portion, with the pins 12 extending into the gaps provided between the contact surfaces on the side arms 14 and 16 and the contact surfaces on the center portion 22. More specifically, with the tool in an opened position as illustrated in FIG. 4, a narrow width IC will be placed on the narrow part of center portion 22 such that the pins 12 extend into the gaps between the first contact surfaces 36 and 44a, and 40 and 44b. The user may then simply squeeze the side arms 14 and 16 such that they move toward each other and toward the center portion 22. Upon engaging the pins 12, the side arms force the pins toward the center portion as illustrated in FIG. 5 to thereby adjust the orientation of the pins to produce the result generally illustrated in FIG. 1B. The IC 10 illustrated in FIG. 1B may then readily be inserted into a standard IC socket without further adjustment.

Figure 6:
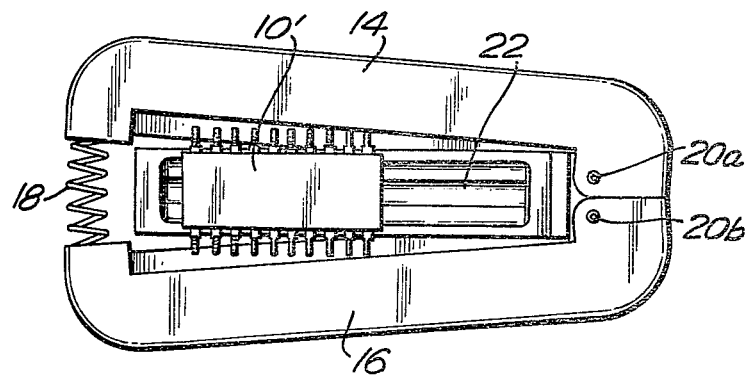
FIG. 6 is a bottom view of the IC pin adjustment tool illustrating the use thereof on an IC having a substantially wider width than the IC associated with FIGS. 2B–5.

Similarly, a larger width IC, such as IC 10′, FIG. 6, may also be adjusted using the same tool by simply flipping the tool over, placing the IC 10′ on the other side of center portion 22 such that it straddles the center portion with the pins extending into the gaps provided between the contact surfaces 38 and 42 on the side arms 14 and 16 and the contact surfaces 46a and 46b on the center portion 22. The user squeezes the side arms 14 and 16 in the manner described above in order to provide a more vertical orientation of the pins 12.

Upon release of the side arms, the side arms separate under the force of spring 18 and the IC can be removed and readily inserted into its socket.

It can thus be seen that the tool according to the present invention provides a rapid and accurate technique for insuring proper alignment of pins for IC's of a choice of widths, such as 0.3″ and 0.6″, and of substantially any length, the tool easily accommodating a 40 pin IC. By simply placing the IC on the appropriate side of the center portion 22, and by squeezing the side arms 14 and 16 together, the IC pins are easily and rapidly adjusted for immediate, subsequent insertion.

Although the invention has been described with respect to specific embodiments, modifications and alterations may be made to the specific embodiments without departing from the spirit and scope of the invention as defined in the appended claims.

What is claimed is:

1. A tool for adjusting the orientation of pins on an integrated circuit chip, said tool comprising a pair of side arms and a center portion of generally T-shaped configuration disposed between said side arms, a first side of said center portion having a first width generally corresponding to the approximate width of an integrated circuit chip of a first size, a second side of said center portion having a second width substantially different from said first width and generally corresponding to the approximate width of an integrated circuit chip of a second size, said surfaces of said side arms adjacent to said center portion having configurations substantially complementary to the surfaces of said center portion adjacent to said surfaces of said side arms, whereby when said chip of a first size is placed on said first side of said center portion, such that said pins extend into gaps between said side arms and said center portion, said side arms may be moved toward each other to force said pins toward said center portion to thereby adjust the orientation of said pins, and whereby when said chip of a second size is placed on said second side of said center portion such that said pins extend into gaps between said side arms and said center portion, said side arms may be moved toward each other to force said pins toward said center portion to thereby adjust the orientation of said pins.

2. The tool as described in claim 1 wherein said pair of side arms are secured to said center portion by a respective pair of hinge means disposed at a first end of said pair of side arms and said center portion.

3. The tool as described in claim 2 further including spring means disposed between said pair of side arms at a second end thereof opposite said first end for biasing said side arms away from each other.

* * * * *